(12) United States Patent
Sun

(10) Patent No.: US 10,134,591 B2
(45) Date of Patent: Nov. 20, 2018

(54) METHOD FOR MANUFACTURING A SEMICONDUCTOR DEVICE

(71) Applicant: Tandem Sun AB, Sollentuna (SE)

(72) Inventor: Yanting Sun, Sollentuna (SE)

(73) Assignee: Tandem Sun AB, Sollentuna (SE)

( * ) Notice: Subject to any disclaimer, the term of this patent is extended or adjusted under 35 U.S.C. 154(b) by 0 days.

(21) Appl. No.: 15/517,681

(22) PCT Filed: Oct. 7, 2014

(86) PCT No.: PCT/SE2014/051170
§ 371 (c)(1),
(2) Date: Apr. 7, 2017

(87) PCT Pub. No.: WO2016/056960
PCT Pub. Date: Apr. 14, 2016

(65) Prior Publication Data
US 2017/0309482 A1    Oct. 26, 2017

(51) Int. Cl.
*H01L 21/02* (2006.01)
*H01L 31/028* (2006.01)
(Continued)

(52) U.S. Cl.
CPC .. *H01L 21/02645* (2013.01); *H01L 21/02381* (2013.01); *H01L 21/02461* (2013.01);
(Continued)

(58) Field of Classification Search
CPC .................. H01L 21/30604; H01L 21/02645
See application file for complete search history.

(56) References Cited

U.S. PATENT DOCUMENTS

| 8,299,502 B2 * | 10/2012 | Lourdudoss | ........ H01L 21/0237 |
| | | | 257/183 |
| 2002/0022290 A1 | 2/2002 | Kong et al. | |

(Continued)

FOREIGN PATENT DOCUMENTS

| WO | 2008115135 A1 | 9/2008 |
| WO | 2013154485 A1 | 10/2013 |

*Primary Examiner* — Thao P Le
(74) *Attorney, Agent, or Firm* — Gable Gotwals

(57) ABSTRACT

This invention is directed toward a method for manufacturing a semiconductor device with a heterostructure comprises covering a semiconductor structure with a seed layer structure; forming one or more separated circularly shaped openings in the seed layer structure to expose the semiconductor structure therein, and leave the seed layer structure outside the one or more separated circularly shaped openings; forming an insulator layer thereon; etching the obtained structure to (i) expose at least a portion of the seed layer structure, such that the exposed at least portion of the seed layer structure surrounds each of the one or more separated circularly shaped openings, and (ii) optionally expose the semiconductor structure, in the one or more separated circularly shaped openings; and epitaxially growing a semiconductor layer from the exposed at least portion of the seed layer structure, firstly mainly vertically and then into each of the one or more separated circularly shaped openings until the epitaxially grown semiconductor layer coalesces with the insulator layer or the semiconductor structure in each of the one or more separated circularly shaped openings.

30 Claims, 9 Drawing Sheets

(51) Int. Cl.
*H01L 31/0304* (2006.01)
*H01L 31/0336* (2006.01)
*H01L 31/107* (2006.01)
*H01L 31/18* (2006.01)

(52) U.S. Cl.
CPC .. *H01L 21/02463* (2013.01); *H01L 21/02505* (2013.01); *H01L 21/02543* (2013.01); *H01L 21/02546* (2013.01); *H01L 21/02639* (2013.01); *H01L 21/02647* (2013.01); *H01L 31/028* (2013.01); *H01L 31/0336* (2013.01); *H01L 31/03046* (2013.01); *H01L 31/1075* (2013.01); *H01L 31/1844* (2013.01)

(56) References Cited

U.S. PATENT DOCUMENTS

| | | | | |
|---|---|---|---|---|
| 2009/0056805 | A1* | 3/2009 | Barnett | H01L 31/1804 136/256 |
| 2012/0326210 | A1* | 12/2012 | Shi | H01L 29/245 257/190 |
| 2014/0138620 | A1 | 5/2014 | Glo | |

* cited by examiner

METHOD FOR MANUFACTURING A SEMICONDUCTOR DEVICE

CROSS-REFERENCE TO RELATED APPLICATIONS

This application is the United States National Phase of PCT Patent Application No. PCT/SE2014/051170 filed on 7 Oct. 2014, which is incorporated herein by reference.

TECHNICAL FIELD OF THE INVENTION

The present invention relates generally to semiconductor device technology, and particularly to methods for manufacturing a semiconductor device and to semiconductor device.

DESCRIPTION OF RELATED ART

WO 2013/154485 discloses a method for manufacturing a semiconductor device comprising the steps of: forming a buffer layer and a seed layer on a dissimilar semiconductor substrate on a front side thereof, followed by processing to provide one or more seed island mesas, typically having a particular orientation on the dissimilar semiconductor substrate. An insulating layer is then formed on the at least one seed island mesa and an opening is created in the insulating layer. Then a semiconductor growth layer having consecutive semiconductor regions grown onto each other is grown from the opening of the insulating layer. The growth is selective: epitaxially, vertically and laterally, wherein a first region having high defect density is only grown vertically from the opening, while the other regions are grown until at least one semiconductor region having low defect density coalesces with the front side of the semiconductor substrate. The first region and a second region of the semiconductor growth layer with high defect density can be removed by etching and a third region with low defect density is not etched, typically protected from etching to prepare a semiconductor layer for semiconductor device fabrication. In this way, a semiconductor device having a heterostructure, for instance a semiconductor substrate, with low defect density can be manufactured on a dissimilar substrate.

However, a drawback with the method is the seed island mesas have to be formed in a particular orientation with respect to the crystal direction of the semiconductor substrate to maximize the aspect ratio between the laterally grown third region with low defect density and the vertical growth. This may add processing time and costs to the manufacturing process.

A further drawback is that dislocations may occur in the epixatially grown semiconductor layer in regions where growth fronts meet between two mesas.

Another design is disclosed in U.S. Pat. No. 8,299,502, which, however, does not disclose the use of seed island mesas. A semiconductor heterostructure includes a crystalline substrate of a first semiconductor material and a mask disposed over a surface of the crystalline substrate. The mask has openings including a plurality of elongated opening sections with a width less than or equal to 900 nm. At least one first section of the elongated opening sections is directed non-parallel relative to at least one second section of the elongated opening sections. The semiconductor heterostructure further includes an overgrowth crystalline layer of a second semiconductor material, filling the openings and covering the mask. A method for manufacturing of such a semiconductor heterostructure is also disclosed.

SUMMARY OF THE INVENTION

The present inventor has found a novel design for semiconductor heterostructures with epitaxially overgrown semiconductor layers, which can be applied both for seed island mesas and planar seed layers.

In one aspect, a method for manufacturing a semiconductor device with a heterostructure is provided, according to which a semiconductor structure including a semiconductor substrate is covered with a seed layer structure. One or more separated circularly shaped openings is/are formed in the seed layer structure to expose the semiconductor structure therein, while the seed layer structure is left outside the one or more separated circularly shaped openings. An insulator layer is formed thereon, after which the obtained structure is etched to (i) expose the surface at least a portion of the seed layer structure, such that the exposed at least portion of the seed layer structure surrounds each of the one or more separated circularly shaped openings, and (ii) optionally expose the surface of semiconductor structure, in the one or more separated circularly shaped openings. Next, a semiconductor layer is epitaxially grown from the surface exposed at least portion of the seed layer structure, firstly mainly vertically and then into each of the one or more separated circularly shaped openings until the epitaxially grown semiconductor layer coalesces with the insulator layer or the semiconductor structure in each of the one or more separated circularly shaped openings, to thereby form a uniform continuous grown semiconductor layer sections in each of the one or more separated circularly shaped openings.

Hereby, the epitaxially grown semiconductor layer forms a first region having a first defect density during the mainly vertical growth and a second region having a second defect density during the growth in each of the one or more separated circularly shaped openings, wherein the second defect density is lower, preferably much lower, than the first defect density.

For instance, the second defect density may be lower than $10^8$, $10^7$, $10^6$, or $10^5$ cm$^{-2}$, whereas the first defect density may be higher than $10^5$, $10^6$, $10^7$, or $10^8$ cm$^{-2}$. The exposed at least portion of the seed layer structure, from which the semiconductor layer is epitaxially grown, can have a third defect density, which may be in the same order of magnitude as the first defect density.

While the circularly shaped openings may be arranged with respect to one another in any fashion, one embodiment comprises a design with circularly shaped openings arranged with rows and columns in a two-dimensional pattern, wherein the circularly shaped openings of every second row is arranged displaced in the direction of the row such that the circularly shaped openings of every column are arranged in a staggered pattern. Hereby, the area of the mesa structure can be minimized.

The method is straightforward and the mesa structure surrounding the circularly shaped openings has not to be formed in a particular orientation with respect to the crystal direction of the semiconductor substrate to maximize the lateral overgrowth in openings.

Further, the amount of dislocations in the epixatially grown semiconductor layer is minimized in regions where growth fronts meet between because such growth fronts will not meet along a line but in a single point (in each of the one or more separated circularly shaped openings).

The epitaxially grown semiconductor layer may be an n-type, p-type, or semi-insulating doped semiconductor layer. The material of the epitaxially grown semiconductor layer and the seed layer structure (or seed layer thereof) may be a III-V semiconductor, e.g. InP or GaAs, or a ferromagnetic III-V semiconductor, e.g. GaMnAs, InMnAs, or similar. The semiconductor structure or substrate may be of different doping type than the epitaxially grown semiconductor layer.

Texture may be formed in or above the semiconductor structure or substrate and/or doped silicon areas may be formed in or above the semiconductor structure or substrate within the one or more separated circularly shaped openings before the insulator layer is formed e.g. depending on the semiconductor device to be manufactured.

In one embodiment, the step of etching comprises patterning and etching using photolithographic techniques to expose at least a portion of the seed layer structure, such that the exposed at least portion of the seed layer structure surrounds each of the one or more separated circularly shaped openings. The etching may comprise etching away the insulator layer in the one or more separated circularly shaped openings to expose the surface of semiconductor structure and the epitaxial growth of the semiconductor layer may be performed until the epitaxially grown semiconductor layer coalesces with the semiconductor structure in each of the one or more separated circularly shaped openings and forms a uniform continuous layer in each of the one or more separated circularly openings.

Alternatively, the insulator layer is left in the one or more separated circularly shaped openings in the etching and the epitaxial growth of the semiconductor layer is performed until the epitaxially grown semiconductor layer coalesces with the insulator layer in each of the one or more separated circularly shaped openings and forms a uniform continuous layer in each of the one or more separated circularly openings.

In another embodiment, the portions of the insulator layer on top of the seed layer structure are removed by anisotropic etching in a self-aligned process leaving the insulator layer only as side walls on the sides of the seed layer structure in each of the one or more separated circularly shaped openings.

By such procedure, the separated circularly shaped openings may be arranged closer to another while providing sufficient seeding surfaces for the epitaxial growth. The self-aligned positions of these seeding surfaces do not require safety distances for misalignments in the photolithographic process otherwise employed. The self-aligned process provides for a minimum of unusable area (which is not seeding layer area or area, in which epitaxial growth layer for device manufacturing is formed (circularly shaped openings)).

In a second aspect, a method for manufacturing a semiconductor device with a heterostructure is provided, according to which a semiconductor structure is covered with a seed layer structure. An insulator layer is formed thereon and portions of the insulator layer are removed to expose portions of the seed lay structure, while one or more separated circularly shaped portions of the insulator layer is/are left on the seed layer structure. A semiconductor layer is epitaxially grown from the exposed portions of the seed layer structure, firstly mainly vertically and then onto each of the one or more separated circularly shaped portions of the insulator layer until the epitaxially grown semiconductor layer coalesces with the insulator layer in each of the one or more separated circularly shaped portions of the insulator layer.

Hereby, the epitaxially grown semiconductor layer may form a first region having a first defect density during the mainly vertical growth and a second region having a second defect density during the growth onto each of the one or more separated circularly shaped portions of the insulator layer, wherein the second defect density is lower than the first defect density.

Example figures of the first and second defect densities and of the defect density of the exposed portions of the seed lay structure may be as given above.

The first and second aspects may be further modified according to the below.

The seed layer structure may be a single seed layer, or a multilayer comprising e.g. a buffer layer and a seed layer on top of the buffer layer.

The semiconductor structure referred to as a start material above may comprise a semiconductor substrate and optionally one or more layers thereon such as for instance a semiconductor layer and/or an insulator layer. The term heterostructure refers to that the substrate and the epitaxially grown semiconductor layer, which is of the same material as the seed layer, are of different materials.

The seed layer may be of a III-V semiconductor material, such as e.g. a material comprising InP, whereas the substrate of the semiconductor structure is of another material, such as a IV semiconductor material, e.g. silicon.

In one embodiment, the one or more separated circularly shaped openings or the one or more separated circularly shaped portions of the insulator layer are a plurality. The shortest distance between each two adjacent separated circularly shaped openings or two separated circularly shaped portions of the insulator layer may be less than 4, 3, 2 or 1 μm.

One electronic component, preferably active electronic component, may be formed from the epitaxially grown semiconductor layer grown in each of the one or more separated circularly shaped openings or on top of each of the one or more separated circularly shaped portions of the insulator layer. In such instance, the semiconductor structure or substrate and the epitaxially grown semiconductor layer may be of different doping type. For instance, the semiconductor structure may be of n-doping type and the epitaxially grown semiconductor layer may be of p-doping type.

Alternatively, several electronic components, preferably active electronic components, are formed from the epitaxially grown semiconductor layer grown in each of the one or more separated circularly shaped openings or on top of each of the one or more separated circularly shaped portions of the insulator layer.

The one or several electronic components may each be a solar cell, a laser diode, or a light sensitive component such as a photodiode or avalanche photodiode.

A third aspect refers a semiconductor device manufactured according to any of the methods disclosed above.

A fourth respect refers to a semiconductor device comprising a semiconductor structure, one or more separated circularly shaped layer portions of an epitaxial semiconductor on the semiconductor structure, and one or more electronic components, preferably active electronic components, such as e.g. solar cells, laser diodes, or light sensitive components, such as photodiodes or avalanche photodiodes, formed at least partly in each of the one or more circularly shaped layer portions of an epitaxial semiconductor.

An insulator may covers the outer sidewalls of each of the one or more circularly shaped layer portions of an epitaxial semiconductor and a seed layer structure may cover the spaces between the one or more circularly shaped layer portions of an epitaxial semiconductor having outer sidewalls covered by an insulator.

A fifth aspect refers to a semiconductor device comprising semiconductor structure or substrate, a seed layer structure thereon, one or more separated circularly shaped layer portions of an insulator thereon, an epitaxial semiconductor layer on top of the one or more separated circularly shaped layer portions of an insulator, and one or more electronic components, preferably active electronic components, such as e.g. solar cells, laser diodes, or light sensitive components, such as photodiodes or avalanche photodiodes, formed at least partly in the epitaxial semiconductor layer on top of each of the one or more separated circularly shaped layer portions of an insulator.

The one or more separated circularly shaped openings (the first and third aspects), the one or more separated circularly shaped portions of the insulator layer (the second and third aspects), the one or more separated circularly shaped layer portions of an epitaxial semiconductor (fourth aspect), and the one or more separated circularly shaped layer portions of an insulator on the seed layer structure (the fifth aspect) may have a diameter in the range of 1-100 microns.

Another challenge with the teaching of WO 2013/154485 is that the opening made in the insulating layer on top of the seed island mesas to expose portions thereof is time consuming and requires a safety margin, which in turn creates an unusable area between the expose portions of the seed island mesas and the exposed portions of the substrate.

A sixth aspect refers to method for manufacturing a semiconductor device with a heterostructure. According to the method a semiconductor structure or substrate is covered with a seed layer structure and one or more openings is/are formed in the seed layer structure to expose the semiconductor structure therein. An insulator layer is formed thereon and portions of the insulator layer are removed by anisotropic etching in a self-aligned process leaving the insulator layer only as side walls in each of the one or more openings. Thereafter, a semiconductor layer is epitaxially growing from the exposed portions of the seed layer structure, firstly mainly vertically and then into each of the one or more openings until the epitaxially grown semiconductor layer coalesces with the semiconductor structure in each of the one or more openings. Before the epitaxial growth, the exposed portions of the seed layer may be chemically cleaned or wet etched to reduce the thickness of seed structure.

The one or more openings may each be formed as a stripe shaped opening e.g. aligned at an angle off the major flat direction on the semiconductor structure or substrate to maximize the lateral overgrowth in the one or more openings.

Alternatively, the one or more openings may each be formed as a circularly shaped opening or square shaped opening, optionally with rounded corners.

The width of each stripe shaped opening, the diameter of each circularly shaped opening, and/or the side length of each square shaped opening may be in the range of 10-100 microns.

A seventh aspect refers to a semiconductor device manufactured according to the method of the sixth aspect.

Hereby, the one or more openings may be arranged closer to another while providing sufficient seeding surfaces for the epitaxial growth. The distance between the openings can be smaller than 4, 3, 2, 1 or 0.5 µm. The self-aligned positions of these seeding surfaces do not require safety distances for misalignments in the photolithographic process otherwise employed. The self-aligned process provides for a minimum of unusable area.

The epitaxially grown semiconductor layer may be an n-type, p-type, or semi-insulating doped semiconductor layer. The material of the epitaxially grown semiconductor layer and a the seed layer structure (or seed layer thereof) may be a III-V semiconductor, e.g. InP or GaAs, or a ferromagnetic III-V semiconductor, e.g. GaMnAs, InMnAs, or similar. Further characteristics and advantages will be evident from the following detailed description of embodiments given hereinafter and the accompanying FIGS. 1-7, which are given by way of illustration only, and are thus not limitative.

BRIEF DESCRIPTION OF THE DRAWINGS

FIGS. 1*a-b* and *d-g* are side sectional views while FIG. 1*c* is a top view.

FIGS. 3*a-b* are side sectional views while FIG. 3*c* is a top view.

FIGS. 4*a-b* and *d* are side sectional views while FIG. 4*c* is a top view.

FIG. 6*a* is a side sectional view, whereas FIG. 6*b* is a sectional view along line A-A of FIG. 6*a*.

FIG. 7*a* is a side sectional view, whereas FIG. 7*b* is a sectional view along line A-A of FIG. 6*a*.

Identical reference numerals are used throughout the Figures to denote identical or similar components, portions, details and the like of the various embodiments.

DETAILED DESCRIPTION OF EMBODIMENTS

FIGS. 1*a-g* illustrate schematically a semiconductor device with a heterostructure during manufacturing according to a first embodiment.

A semiconductor structure 50 is covered by a seed layer structure 52, 54.

The semiconductor structure 50 comprises a substrate, which may be of a IV semiconductor material, e.g. (001) silicon.

The seed layer structure 52, 54 may comprise a buffer layer 52 made of, for example GaAs, formed, for instance grown, on the semiconductor structure 50, by metalorganic vapor phase epitaxy (MOVPE) at low temperature, and a seed layer 54 made of a III-V semiconductor material, for example InP is grown by MOVPE and can have a thickness of approximately 2 µm. Alternatively, the seed layer structure is composed of a single seed layer.

Figure 1A:
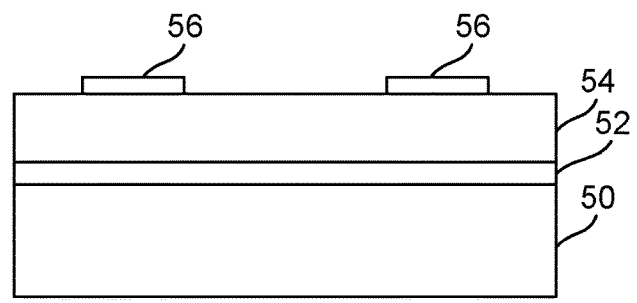
FIGS. 1*a-g* illustrate schematically a semiconductor device with a heterostructure during manufacturing according to a first embodiment.

A protective mesa mask 56 made of, for example $SiO_2$ or $SiN_x$ is deposited by plasma-enhanced chemical vapor deposition (PECVD) and patterned by photolithography and dry etching, for example reactive ion etching or inductively coupled plasma etching, or by chemical etching in HF solution. Typically, the protective mesa mask 56 can have thickness of more than 300 Å and a width corresponding to a desired mesa width. The resulting structure is shown in FIG. 1a.

Figure 1B:
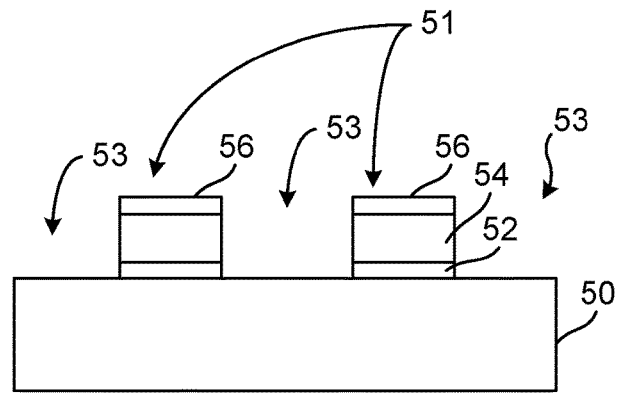
Figure 1C:
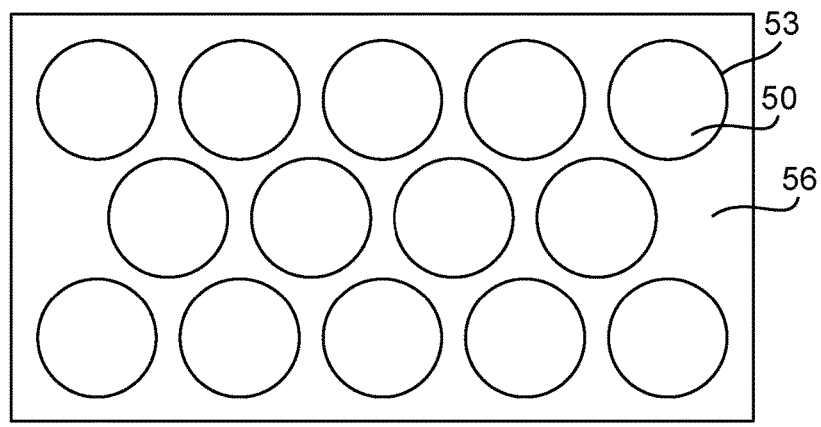

The seed layer structure (the seed layer 54 and the buffer layer 52) is processed using the protective mesa mask 56 to form a mesa structure 51 typically by dry etching. The resulting structure is shown in FIG. 1b. The protective mesa mask 56 is so shaped that, one or more separated circularly shaped openings 53 are formed in the seed layer structure 52, 54 to expose the semiconductor structure 50 therein, and leave the seed layer structure 52, 54 outside the one or more separated circularly shaped openings 53. FIG. 1c illustrates schematically the structure from above.

Figure 2:
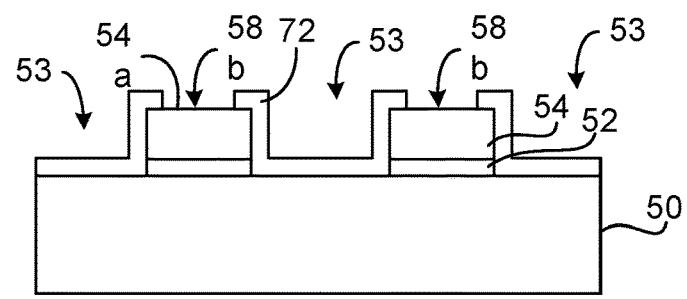
FIG. 2 illustrates schematically, in a side sectional view, a semiconductor device with a heterostructure during manufacturing according to a second embodiment.

Note that while FIG. 1c illustrates 14 circularly shaped openings 53 in three rows and the side sectional view of FIG. 2 in FIG. 1b only illustrates one circularly shaped opening 53 in the center and parts of two further circularly shaped openings 53 in the left-hand and right-hand ends of the Figure, the concept may be used for manufacturing a semiconductor device with any number of circularly shaped openings. Further, the circularly shaped openings 53 may arranged with respect to one another in any fashion even though the illustrated design with the circularly shaped openings 53 of every second row being displaced in the direction of the row such that the circularly shaped openings 53 in each column is arranged in a staggered manner to minimize the area of the mesa structure 51.

The shortest distance between two adjacent separated circularly shaped openings 53 may be less than 4 µm, preferably less than 3 µm, more preferably less than 2 µm, and most preferably less than 1 µm.

The diameter of each of the adjacent separated circularly shaped openings 53 may be 10-100 µm, but can be smaller than 10 µm or larger than 100 µm.

Figure 1D:
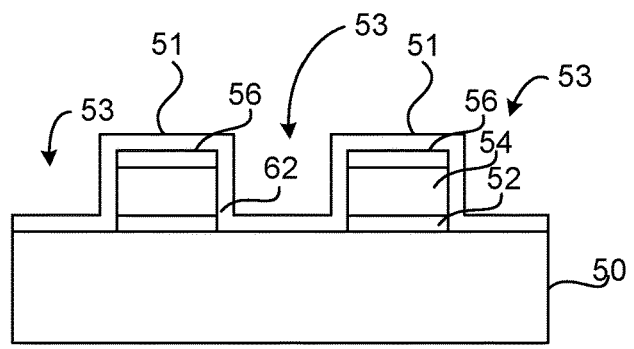

Next, an insulating layer 62 made of, for example $Si_3N_4$, is formed over the semiconductor structure 50 and the protective mesa mask 56, and is typically deposited by PECVD. The insulating layer 62 can have a thickness of more than 300 Å. The resulting structure is shown in FIG. 1d.

Figure 1E:
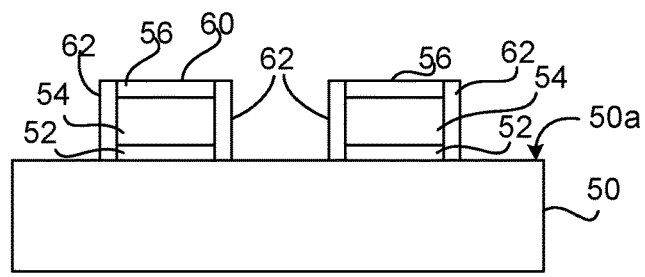
Figure 1F:
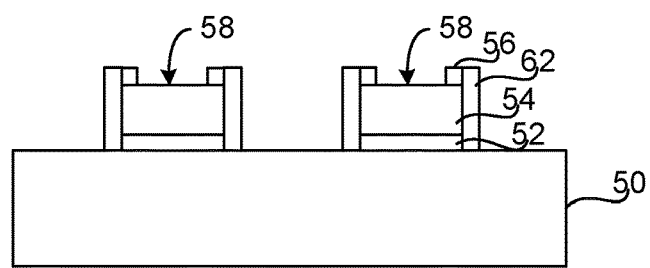

The insulating layer 62 is etched e.g. by $SF_6$ and $CH_4$ in a reactive ion etching reactor. Chemical $CHF_3$ can alternatively be used to etch the insulating layer 62 in the reactive ion etching reactor. The insulating layer 62 is etched away completely from the top surface 60 of the protective mesa mask 56) of the mesa structure 51 and the semiconductor structure 50, whereas the insulating layer 62 on the side walls in each of the one or more separated circularly shaped opening 53 is protected, for instance by polymers formed during etching and an anisotropic etching mechanism and is intact after etching. As a result, the top surface 60 of the mesa structure 51 and the front side 50a of the semiconductor structure 50 are exposed as shown in FIG. 1e. An opening 58 is patterned by photolithography and etched through the protective mesa mask 56 to expose a portion of the seed layer 54 of the seed layer structure 52, 54. The resulting structure is shown in FIG. 1f.

Next, a semiconductor layer 80 is epitaxially grown from the exposed portion of the seed layer 54, firstly mainly vertically and then into each of the one or more separated circularly shaped openings 53 until the epitaxially grown semiconductor layer 80 coalesces with the semiconductor structure 50 in each of the one or more separated circularly shaped openings 53 and forms a uniform continuous layer in each of the one or more separated circularly shaped openings 53.

Figure 1G:
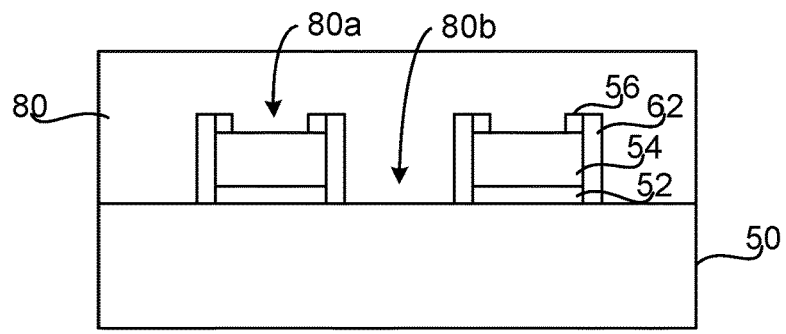

The growth of the epitaxial layer 80 may be carried out using Hydride Vapor Phase Epitaxy (HVPE) or other epitaxial growth methods operated at equilibrium condition providing selectivity of III-V growth over Si, $SiO_2$ and $SiN_x$ surfaces. The front side 50a of the semiconductor structure 50 made of, for example Si, is cleaned properly before the structure is brought to an HYPE growth chamber. A solution of $H_2SO_4:H_2O_2$ and $NH_4OH:H_2O_2$ may be used to remove the organic impurities and particles. Following a wet chemical ex-situ cleaning process, the semiconductor structure 50 may be dipped in a solution of $1HF:10H_2O$ for 10 seconds to remove oxide. As an example, the growth temperature in the HVPE growth chamber may be 620° C. and the pressure may be 20 mBar. With sufficient growth time, which is obvious to a skilled person, the selective growth from the mesa structure 51 will result in wide third semiconductor regions, which will coalesce to form the continuous grown semiconductor layer portion(s) 80 on the front side 50a of the semiconductor structure 50. The resulting structure is shown in FIG. 1g.

The epitaxially grown semiconductor layer forms a first region 80a having a first defect density during the mainly vertical growth and a second region 80b having a second defect density during the growth in each of the one or more separated circularly shaped openings 53, wherein the second defect density will preferably be lower than the first defect density.

The second defect density may be lower than $10^8$ cm$^{-2}$, preferably lower than $10^7$ cm$^{-2}$, more preferably lower than $10^6$ cm$^{-2}$, and most preferably lower than $10^5$ cm$^{-2}$, whereas the first defect density may be higher than $10^5$ cm$^{-2}$, preferably higher than $10^6$ cm$^{-2}$, more preferably higher than $10^7$ cm$^{-2}$, and most preferably higher than $10^8$ cm$^{-2}$.

The exposed of the seed layer 54 has a third defect density, which may be in the same order of magnitude as the first defect density.

The epitaxially grown semiconductor layer 80 may be an n-type, p-type, or semi-insulating doped semiconductor layer. The material of the epitaxially grown semiconductor layer and the seed layer 54 may be a III-V semiconductor, e.g. InP or GaAs, or a ferromagnetic III-V semiconductor, e.g. GaMnAs, InMnAs, or similar.

The processing may then be continued as disclosed in WO 2013/154485, e.g. by removing the upper part of the epitaxially grown semiconductor layer 80 to expose the remaining portion of the protective mesa mask 56 and the upper surface of the insulating layer 62 on the side walls in each of the one or more separated circularly shaped openings 53, and then removing the remaining portion of the protective mesa mask 56, the insulating layer 62 on the side walls in each of the one or more separated circularly shaped openings 53, and the seed layer structure 52, 54 to form one or more separated circularly shaped layer portions of the epitaxially grown semiconductor layer 80, is which device formation can take place. The contents of WO 2013/154485 is hereby incorporated by reference.

In one variant, one electronic component, preferably active electronic component, is formed from the epitaxially grown semiconductor layer 80 grown in each of the one or more separated circularly shaped openings 53.

In another variant, several electronic components, preferably active electronic components, are formed from the epitaxially grown semiconductor layer 80 grown in each of the one or more separated circularly shaped openings 53.

The one or several electronic components may each be a solar cell, a laser diode, or a light sensitive component, such as a photodiode or an avalanche photodiode.

FIG. 2 illustrates schematically, in a side sectional view, a semiconductor device with a heterostructure during manufacturing according to a second embodiment, which is identical with previous embodiment up to the formation of the one or more separated circularly shaped openings 53 in the seed layer structure 52, 54 using the protective mesa mask 56. Subsequently, thereto the mesa mask 56 is removed by chemical etching in HF solution, and an insulating layer 72, made for instance of $Si_3N_4$, is deposited on the obtained structure by for instance PECVD. Then, openings 58b are etched in the insulating layer 72 to expose a portion of the seed layer 54 of the seed layer structure 52, 54. Thereafter, a semiconductor layer 80 is epitaxially grown from the exposed portion of the seed layer 54, firstly mainly vertically and then into each of the one or more separated circularly shaped openings 53 until the epitaxially grown semiconductor layer 80 coalesces with the insulating layer 72 in each of the one or more separated circularly shaped openings 53 and forms a uniform continuous grown layer 80 in each of the one or more separated circularly shaped openings 53. The epitaxial growth may be performed as disclosed above with reference to the embodiment of FIGS. 1a-g.

The processing may then continue as disclosed above. The main difference between the FIGS. 1 and 2 embodiments is that when the epitaxially grown semiconductor layer 80 is formed on top of a semiconductor structure, e.g. a semiconductor substrate, in the embodiment of FIGS. 1a-g, whereas the epitaxially grown semiconductor layer 80 is formed on top of an insulator layer in the embodiment of FIG. 2.

Figure 3A:
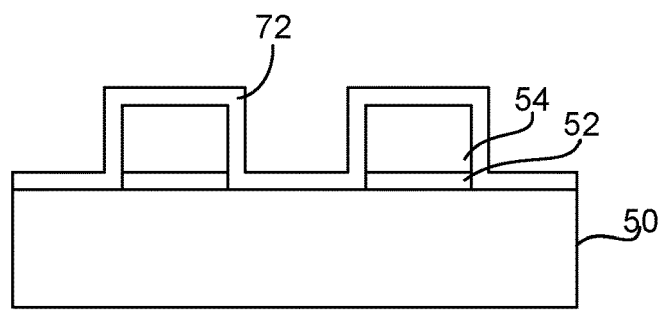
FIGS. 3*a-c* illustrate schematically a semiconductor device with a heterostructure during manufacturing according to a third embodiment.
Figure 3B:
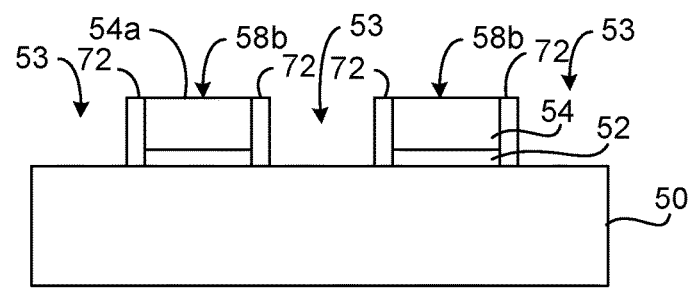
Figure 3C:
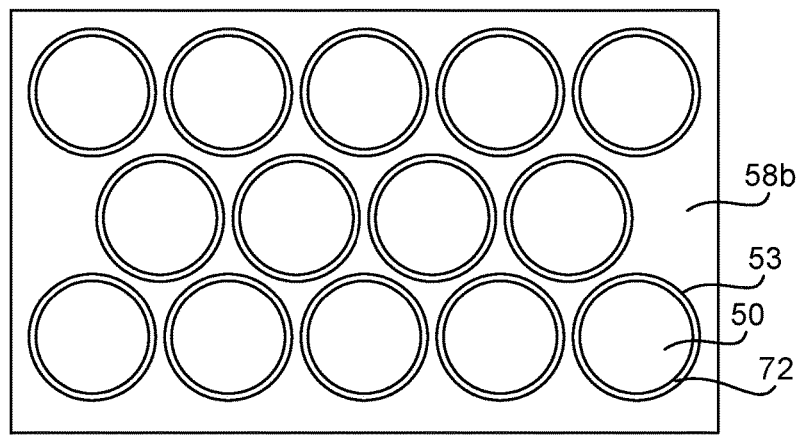

FIGS. 3a-c illustrate schematically a semiconductor device with a heterostructure during manufacturing according to a third embodiment, which is identical with the embodiment of FIGS. 1a-g up to the formation of the one or more separated circularly shaped openings 53 in the seed layer structure 52, 54 using the protective mesa mask 56. Subsequently, thereto the mesa mask 56 is removed, and an insulating layer 72, made for instance of $Si_3N_4$, is deposited on the obtained structure by for instance PECVD. The resulting structure is shown in FIG. 3a.

Then, the insulating layer 72 is etched anisotropically e.g. without using a mask, in a self-aligned process exposing the seed layer 54 of the seed layer structure 52, 54 and the semiconductor structure 50 in the separated circularly shaped openings 53, and leaving the insulating layer 72 only a sidewall spacers in the separated circularly shaped openings 53, in a self-aligned process. The resulting structure is shown in FIGS. 3b (side sectional view) and 3c (top view). In FIG. 3c, the upper surface of the seed layer structure 58b and the annular shaped sidewall spacers 72 within the separated circularly shaped openings 53 are clearly apparent. The exposed portion of the seed layer 54 of the seed layer structure 52, 54 is self aligned to the sidewall spacers of the insulating layer 72.

Thereafter, a semiconductor layer is epitaxially grown from the exposed seed layer 54, optionally after chemically cleaning or wet chemical etching to reduce the thickness of the seed layer 54, firstly mainly vertically and then into each of the separated circularly shaped openings 53 until the epitaxially grown semiconductor layer coalesces with semiconductor substrate 50 in each of the separated circularly shaped openings 53 and the further processing may then continue as disclosed above. The main difference between the FIGS. 1 and 3 embodiments is that when the epitaxially grown semiconductor layer 80 is grown from a portion only of the seed layer 54 of the seed layer structure 52, 54 as shaped by photolithographic technology in the embodiment of FIGS. 1a-g, whereas the epitaxially grown semiconductor layer is grown from a the entire seed layer 54 of the seed layer structure 52, 54 in the embodiment of FIGS. 1a-g.

The further processing may be performed as disclosed with reference to the embodiment of FIGS. 1a-g.

The semiconductor structure 50 may consist of a semiconductor substrate, optionally with one or more semiconductor layers thereon.

Figures 3D, 3E:
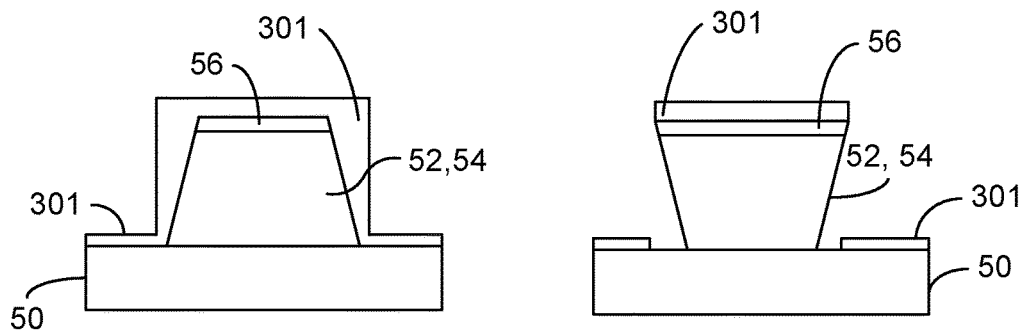
FIGS. 3*d-f* illustrate schematically a semiconductor device in a side sectional view with a heterostructure during manufacturing according to variants of the third embodiment.

Alternatively, the epitaxially grown semiconductor layer is formed on an insulator layer and not on a semiconductor. After the formation of the one or more separated circularly shaped openings 53 in the seed layer structure 52, 54 using the protective mesa mask 56, but before the removal of the mesa mask 56, a further insulator layer of different material than the mesa mask 56 may be deposited. The mesa mask 56 may be of $Si_3N_4$ whereas the further insulator layer may be of $Al_2O_3$. Examples of resulting structures are shown in FIGS. 3d and 3e for different shapes of the seed layer structure 52, 54. The further insulating layer, denoted by 301, may be deposited by e-beam evaporation.

Subsequent thereto, the mesa mask 56 is removed by selective etching using e.g. $H_3PO_4$, which will not etch the $Al_2O_3$ layer 301. When the $Si_3N_4$ layer 56 on top of mesa structure 52, 54 is removed, also the $Al_2O_3$ layer 301 section on top of the $Si_3N_4$ layer 56 is removed in a lift off process. Thereby, an exposed, clean mesa surface is obtained. The process is self-aligned without requirement of lithography. The lift off process is facilitated by a shape of the seed layer structure 52, 54 as shown in FIG. 3e.

Thereafter, the insulator layer 72 is then deposited on the obtained structure by for instance PECVD, the resulting structure of which being shown in FIG. 3a. The process then continues as disclosed with reference to FIGS. 3a-c.

Figure 3F:
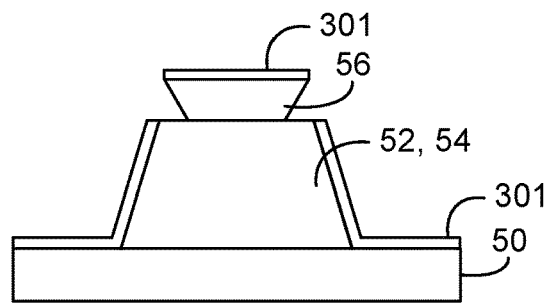

Alternatively, using the shape of the seed layer structure 52, 54 as shown in FIG. 3d, engineering the shape of the mesa mask 56 to assist the lift off process, and depositing the further insulator layer 301 by e-beam evaporation, a structure as shown in FIG. 3f is obtained.

Then, the mesa mask 56 is removed by selective etching using e.g. $H_3PO_4$, wherein also the further insulator layer 301 section on top of the mesa mask 56 is removed in a lift off process. As a result, the further insulator layer 301 remains not only on the semiconductor structure 50, but also as sidewall spacers in the separated circularly shaped openings 53, in a self-aligned process. Hereby, the deposition and self-aligned etching of the insulator layer 72 can be dispensed with, and the process can continue with the semiconductor layer being epitaxially grown from the exposed seed layer 54 of the seed layer structure 52, 54 as disclosed above.

The shapes of the one or more openings 53 may be different than what is disclosed in FIG. 3c. Each of the one or more openings 53 may be formed as a stripe shaped opening e.g. aligned at an angle, e.g. 30°, off the [110] direction on a (001) substrate to maximize the lateral overgrowth in the one or more openings, or as square shaped opening optionally with rounded corners. The distance between the openings can be smaller than 4, 3, 2, 1 or 0.5 µm.

More generally, the one or more openings may each be formed as a stripe shaped opening aligned at an angle off the major flat direction on the semiconductor structure or substrate to maximize the lateral overgrowth in the one or more openings.

A layout with such stripe shaped openings is illustrated in WO 2013/154485 A1.

Figure 4A:
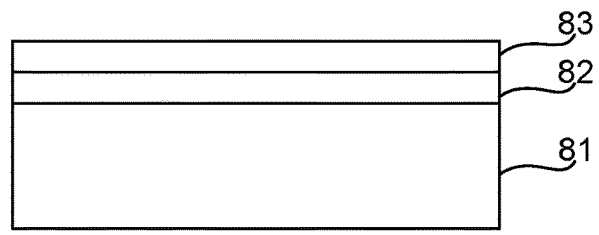
FIGS. 4*a-d* illustrate schematically a semiconductor device with a heterostructure during manufacturing according to a fourth embodiment.
Figure 4B:
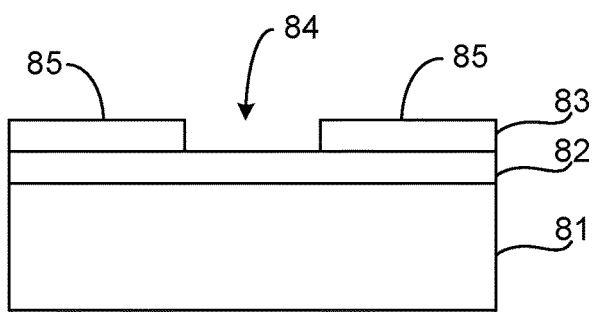
Figure 4C:
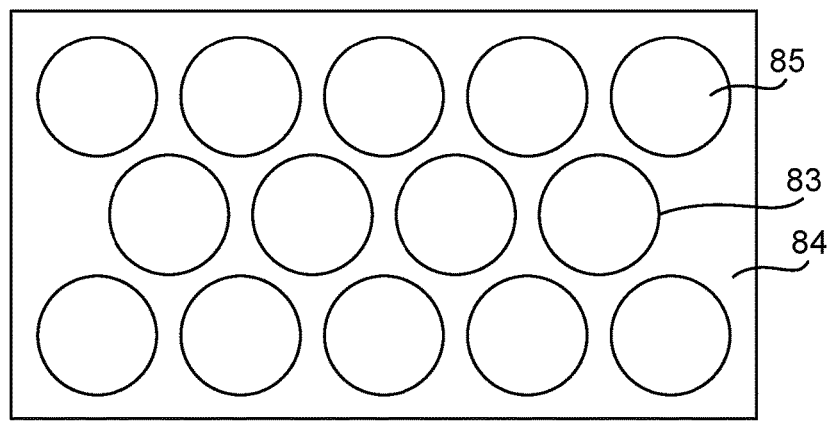
Figure 4D:
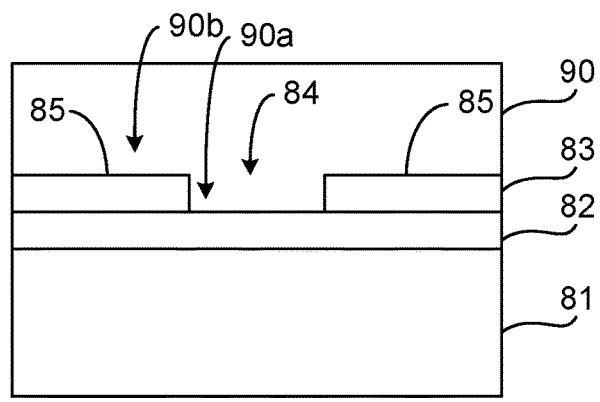

FIGS. 4a-d illustrate schematically a semiconductor device with a heterostructure during manufacturing according to a fourth embodiment. FIGS. 4a-b and d are side sectional views while FIG. 4c is a top view. A semiconductor structure 81 is covered with a seed layer structure 82, and an insulator layer 83 is formed thereon. The resulting structure is shown in FIG. 4a.

Portions of the insulator layer 83 are removed to form openings 84 in the insulator layer 83 to expose portions of the seed lay structure 82, while one or more separated circularly shaped portions 85 of the insulator layer 83 is/are left on the seed layer structure 82. The resulting structure is shown in FIGS. 4b and c. In FIG. 4c, the openings 84 to expose the portions of the seed lay structure 82 and the separated circularly shaped portions 85 of the insulator layer 83 are clearly apparent.

Next, a semiconductor layer 90 is epitaxially grown from the exposed portions of the seed layer structure 82, firstly mainly vertically and then onto each of the separated circularly shaped portions 85 of the insulator layer 83 until the epitaxially grown semiconductor layer 90 coalesces with each of the separated circularly shaped portions 85 of the insulator layer 83. The epitaxial growth may be performed as disclosed above with reference to FIG. 1a-g.

The semiconductor structure 81 may be a silicon substrate, the seed layer structure 82 may consist of, or comprise as uppermost layer, a seed layer, formed by MOVPE as disclosed above. The insulator layer 83, which may be an oxide or a nitride, may be formed thereon, e.g. by PECVD. The openings 84 in the insulator layer 83 may be formed by ordinary lithographic technology.

Similar to previous embodiments, the epitaxially grown semiconductor layer forms a first region 90a having a first defect density during the mainly vertical growth and a second region 90b having a second defect density during the growth onto each of the separated circularly shaped portions of the insulator layer, wherein the second defect density is preferably lower than the first defect density.

The second defect density may be lower than $10^8$ cm$^{-2}$, preferably lower than $10^7$ cm$^{-2}$, more preferably lower than, or in the order of, $10^6$ cm$^{-2}$, whereas the first defect density may be higher than $10^8$ cm$^{-2}$, and preferably higher than $10^7$ cm$^{-2}$. The exposed at least portion of the seed layer structure has a third defect density, which may be in the same order of magnitude as the first defect density.

Figure 5:
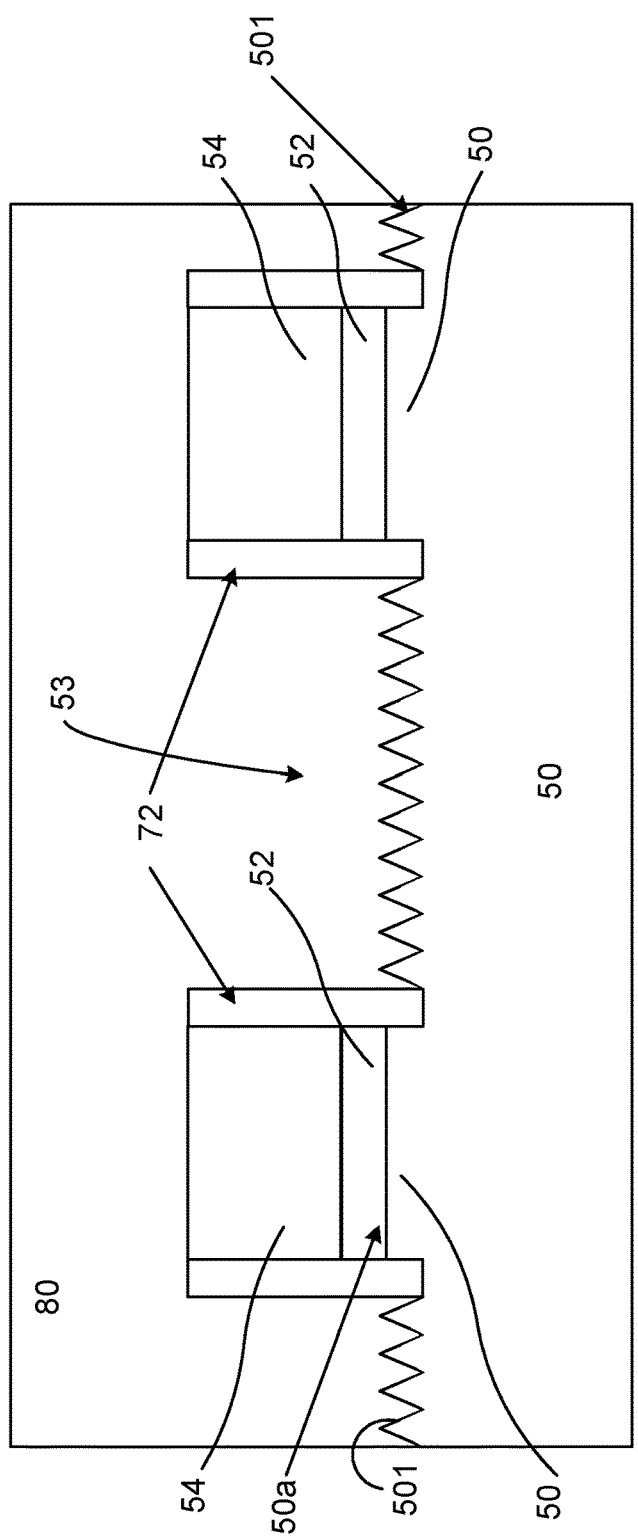
FIG. 5 illustrates schematically a semiconductor device in a side sectional view with a heterostructure according to an embodiment.

FIG. 5 illustrates schematically a semiconductor device in a side sectional view with a heterostructure according to an embodiment preferably manufactured according to the disclosure with respect to FIGS. 3a-f.

The surface 50a of the semiconductor structure or substrate 50 exposed in the one or more circularly shaped openings 53, is engineered to obtain a texture by chemical or dry etching or patterned by lithography and dry etching to nano-sized structures of circular, square, triangle or any other shape. Such texture may result in certain functionality in semiconductor structure or substrate 50 or may modify the properties of the semiconductor structure or substrate 50, such as absorption coefficient or refractive index, etc. The texture can be made into the semiconductor structure or substrate 50 at a stage in the manufacturing process shown in FIG. 3b.

The texture can be made to the semiconductor structure or substrate 50 in any of the other process flows as disclosed above. For instance, the texture can be made into the semiconductor structure or substrate 50 at a stage in the manufacturing process shown in FIG. 1e.

Figure 6A:
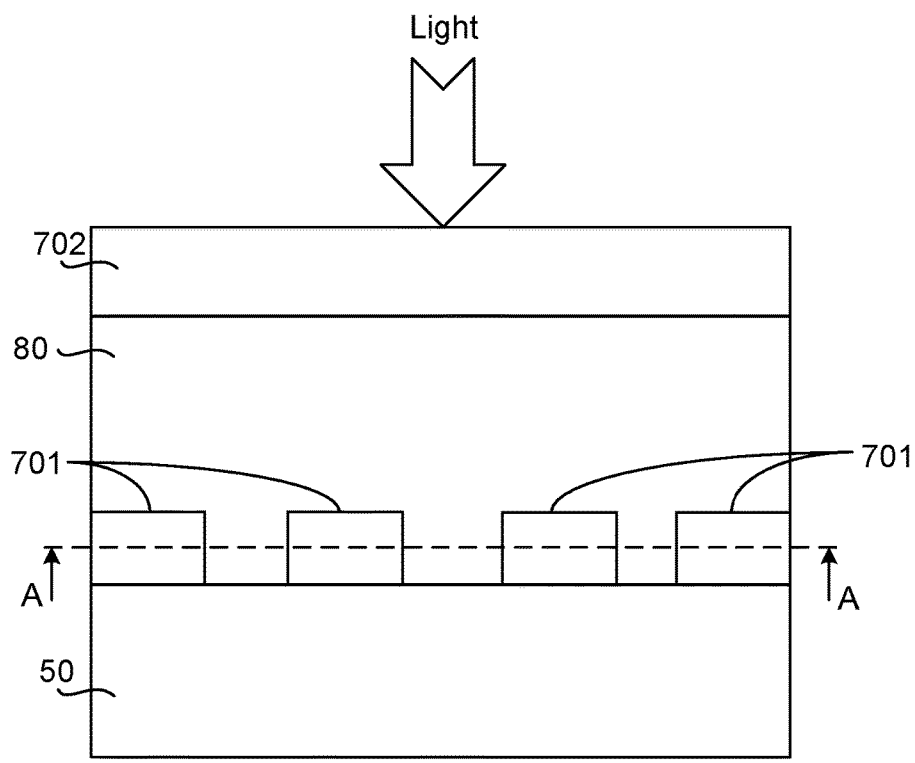
FIGS. 6*a-b* illustrate schematically a semiconductor device with a heterostructure according to a further embodiment.
Figure 6B:
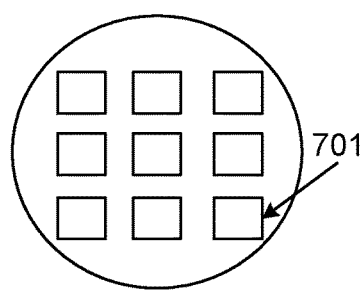

FIGS. 6a-b illustrate schematically a semiconductor device with a heterostructure according to a further embodiment. FIG. 6a is a side sectional view, whereas FIG. 6b is a sectional view along line A-A of FIG. 6a.

The semiconductor device is a multi pixel avalanche photo diode based detector, wherein the semiconductor structure or substrate 50 is an n-type doped silicon substrate with a plurality of p-type doped silicon pixel areas 701 thereon, the epitaxially grown semiconductor layer 80 is an $In_xGa_{1-x}As_yP_{1-y}$ absorption layer, and a p$^+$-type doped $In_{x'}Ga_{1-x'}As_{y'}P_{1-y'}$ light receiving layer 702 is formed thereon.

The p-type doped silicon pixel areas 701 may be formed at the same phase in the process flows as the texture of FIG. 5 is formed and they may be formed in the substrate, e.g. by means of etching the substrate, or by depositing an epitaxial layer, which is subsequently etched. The doping may be performed in any appropriate manner.

The dimension of the p-type silicon pixel areas 701 can be reduced to some hundreds of nanometer, or less, and the distance between the pixels can be 100 nm to several micrometer. The composition of the $In_xGa_{1-x}As_yP_{1-y}$ absorption layer 80 can be tuned to have different band gaps for different wavelengths of the photons absorbed.

Figure 7A:
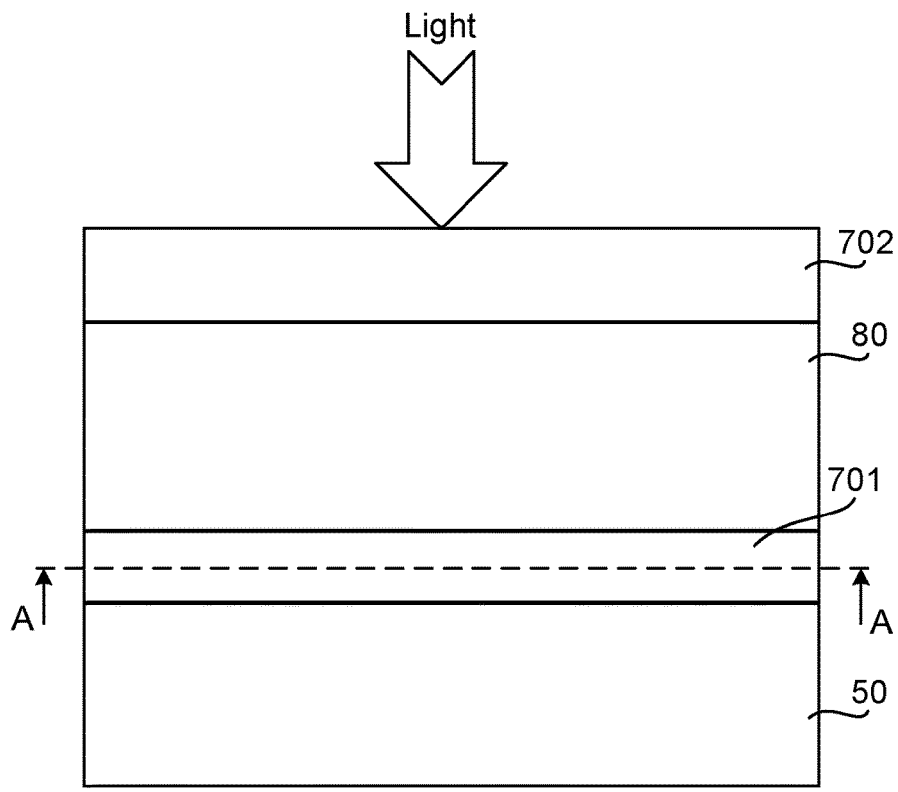
FIGS. 7*a-b* illustrate schematically a semiconductor device with a heterostructure according to a yet further embodiment.
Figure 7B:
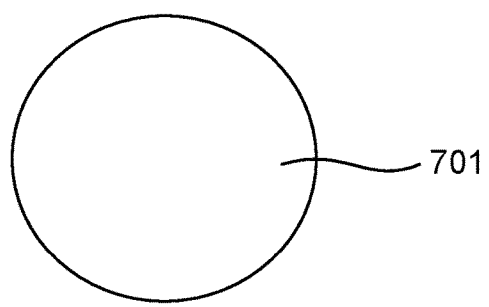

FIGS. 7a-b illustrate schematically a semiconductor device with a heterostructure according to a yet further embodiment. FIG. 7a is a side sectional view, whereas FIG. 7b is a sectional view along line A-A of FIG. 6a.

The semiconductor device is a single pixel avalanche photo diode based detector, wherein the semiconductor structure or substrate 50 is an n-type doped silicon substrate with a single p-type doped multiplication layer 701 thereon, the epitaxially grown semiconductor layer 80 is an $In_xGa_{1-x}As_yP_{1-y}$ absorption layer, and a p$^+$-type doped $In_{x'}Ga_{1-x'}As_{y'}P_{1-y'}$ light receiving layer 702 is formed thereon. The single p-type doped multiplication layer 701 may be formed at the same phase in the process flows as the texture of FIG. 5 is formed and it may be formed in the substrate or as a separately deposited epitaxial layer.

The composition of the $In_xGa_{1-x}As_yP_{1-y}$ absorption layer 80 can be tuned to have different band gaps for different wavelengths of the photons absorbed.

The semiconductor devices of FIGS. 6 and 7 are examples of devices that can be manufactured according to any of the manufacturing methods disclosed with reference to FIGS. 1-3. It shall be appreciated that the epitaxially grown semiconductor layer 80 shown in FIGS. 6 and 7 is a layer portion within a single one of the one ore more of the openings 53 (FIGS. 1-3).

The invention claimed is:

1. A method for manufacturing a semiconductor device with a heterostructure comprising the steps of:
   covering a semiconductor structure with a seed layer structure;
   forming one or more separated circularly shaped openings in the seed layer structure to expose the semiconductor structure therein, and leave the seed layer structure outside said one or more separated circularly shaped openings;

forming an insulator layer thereon;

etching to (i) expose at least a portion of the seed layer structure, such that the exposed at least portion of the seed layer structure surrounds each of the one or more separated circularly shaped openings, and (ii) optionally expose the semiconductor structure, in the one or more separated circularly shaped openings; and epitaxially growing a semiconductor layer from the exposed at least portion of the seed layer structure, firstly mainly vertically and then into each of the one or more separated circularly shaped openings until the epitaxially grown semiconductor layer coalesces with the insulator layer or the semiconductor structure in each of the one or more separated circularly shaped openings.

2. The method of claim 1 wherein the epitaxially grown semiconductor layer forms a first region having a first defect density during the mainly vertical growth and a second region having a second defect density during the growth in each of the one or more separated circularly shaped openings, wherein the second defect density is lower than the first defect density.

3. The method of claim 2 wherein the second defect density has a defect density selected from the group consisting of lower than $10^8$ cm$^{-2}$, lower than $10^7$ cm$^{-2}$, lower than $10^6$ cm$^{-2}$, and lower than $10^5$ cm$^{-2}$.

4. The method of claim 2 wherein the first defect density has a defect density selected from the group consisting of higher than $10^5$ cm$^{-2}$-higher than $10^6$ cm$^{-2}$, higher than $10^7$ cm$^{-2}$, and higher than $10^8$ cm$^{-2}$.

5. The method of claim 2 wherein the exposed at least portion of the seed layer structure has a third defect density, which is in the same order of magnitude as said first defect density.

6. The method of claim 1 wherein the step of etching comprises patterning and etching by photolithography to expose at least a portion of the seed layer structure, such that the exposed at least portion of the seed layer structure surrounds each of the one or more separated circularly shaped openings.

7. The method of claim 6 wherein the step of etching comprises etching away the insulator layer in the one or more separated circularly shaped openings and wherein the epitaxial growth of the semiconductor layer is performed until the epitaxially grown semiconductor layer coalesces with the semiconductor structure, and forms a uniform continuous layer, in each of the one or more separated circularly shaped openings.

8. The method of claim 6 wherein the insulator layer is left in the one or more separated circularly shaped openings in the step of etching and wherein the epitaxial growth of the semiconductor layer is performed until the epitaxially grown semiconductor layer coalesces with the insulator layer, and forms a uniform continuous layer, in each of the one or more separated circularly shaped openings.

9. The method of claim 1 wherein the portions of the insulator layer are removed by anisotropic etching in a self-aligned process leaving the insulator layer only as side walls in each of the one or more separated circularly shaped openings.

10. The method of claim 1 wherein a texture is formed in the surface of the semiconductor structure within the one or more separated circularly shaped openings.

11. The method of claim 1 wherein the epitaxially grown semiconductor layer within the one or more separated circularly shaped openings is doped.

12. A method for manufacturing a semiconductor device with a heterostructure comprising the steps of:

covering a semiconductor structure with a seed layer structure;

forming an insulator layer thereon;

removing portions of the insulator layer to expose portions of the seed layer structure, while one or more separated circularly shaped portions of the insulator layer is/are left on the seed layer structure;

epitaxially growing a semiconductor layer from the exposed portions of the seed layer structure, firstly mainly vertically and then onto each of the one or more separated circularly shaped portions of the insulator layer until the epitaxially grown semiconductor layer coalesces with each of the one or more separated circularly shaped portions of the insulator layer.

13. The method of claim 12 wherein the epitaxially grown semiconductor layer forms a first region having a first defect density during the mainly vertical growth and a second region having a second defect density during the growth onto each of the one or more separated circularly shaped portions of the insulator layer, wherein the second defect density is lower than the first defect density.

14. The method of claim 13 wherein the second defect density is selected from the group consisting of lower than $10^8$ cm$^{-2}$, lower than $10^7$ cm$^{-2}$, and-lower than, $10^6$ cm$^{-2}$.

15. The method of claim 13 wherein the first defect density is selected from the group consisting of higher than $10^8$ cm$^{-2}$ and higher than $10^7$ cm$^{-2}$.

16. The method of claim 13 wherein the exposed at least portion of the seed layer structure has a third defect density, which is in the same order of magnitude as said first defect density.

17. The method of claim 1 wherein the seed layer structure is a single seed layer.

18. The method of claim 1 wherein the seed layer structure is a multilayer comprising a buffer layer and a seed layer on top of the buffer layer.

19. The method of claim 17 wherein the seed layer is of a III-V semiconductor material.

20. The method of claim 12 wherein a substrate of the semiconductor structure is of a IV semiconductor material.

21. The method of claim 12 wherein the one or more separated circularly shaped openings or the one or more separated circularly shaped portions of the insulator layer are a plurality.

22. The method of claim 21 wherein a distance between two adjacent separated circularly shaped openings or two separated circularly shaped portions of the insulator layer has a distance selected from the group consisting of less than 4 µm, less than 3 µm, less than 2 µm, and less than 1 µm.

23. The method of claim 12 comprising forming one electronic component, from the epitaxially grown semiconductor layer grown in each of said one or more separated circularly shaped openings or on top of each of said one or more separated circularly shaped portions of the insulator layer.

24. The method of claim 12 comprising forming several electronic components, including at least one active electronic components, from the epitaxially grown semiconductor layer grown in each of said one or more separated circularly shaped openings or on top of each of said one or more separated circularly shaped portions of the insulator layer.

25. The method of claim 23 wherein the one or several electronic components is selected from the group consisting of a solar cell, a laser diode, a light sensitive component, and an avalanche photo diode based detector.

26. A method for manufacturing a semiconductor device with a heterostructure comprising the steps of:
covering a semiconductor structure with a seed layer structure;
forming one or more openings in the seed layer structure to expose the semiconductor structure therein;
forming an insulator layer thereon;
removing portions of the insulator layer by anisotropic etching in a self-aligned process leaving the insulator layer only as side walls in in each of the one or more openings;
optionally chemically cleaning or wet chemically etching the seed layer structure; and
epitaxially growing a semiconductor layer from the exposed portions of the seed layer structure, firstly mainly vertically and then into each of the one or more openings until the epitaxially grown semiconductor layer coalesces with the semiconductor structure in each of the one or more openings.

27. The method of claim 26 wherein the one or more openings is/are each formed as a stripe shaped opening.

28. The method of claim 27 wherein each one or more stripe shaped opening is formed to extend at an angle to the major flat direction of a substrate of the semiconductor structure.

29. The method of claim 27 wherein the one or more openings is/are each formed as a circularly shaped opening or a square shaped opening, optionally with rounded corners.

30. The method of claim 26 wherein the one or more openings is/are a plurality and the distance between each two adjacent ones of the plurality of openings is selected from the group consisting of less than 4, 3, 2, 1 or 0.5 μm.

* * * * *